(12) United States Patent
Kruijt-Stegeman et al.

(10) Patent No.: US 9,372,396 B2
(45) Date of Patent: Jun. 21, 2016

(54) IMPRINT LITHOGRAPHY METHOD

(75) Inventors: Yvonne Wendela Kruijt-Stegeman, Eindhoven (NL); Andre Bernardus Jeunink, Bergeijk (NL); Johannes Petrus Martinus Bernardus Vermeulen, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 746 days.

(21) Appl. No.: 12/580,097

(22) Filed: Oct. 15, 2009

(65) Prior Publication Data
US 2010/0096774 A1 Apr. 22, 2010

Related U.S. Application Data

(60) Provisional application No. 61/136,963, filed on Oct. 17, 2008.

(51) Int. Cl.
| | |
|---|---|
| *G03F 7/00* | (2006.01) |
| *G03F 7/20* | (2006.01) |
| *B82Y 10/00* | (2011.01) |
| *B82Y 40/00* | (2011.01) |
| *B29C 59/02* | (2006.01) |

(52) U.S. Cl.
CPC .............. *G03F 7/0002* (2013.01); *B82Y 10/00* (2013.01); *B82Y 40/00* (2013.01); *G03F 7/70716* (2013.01); *G03F 7/70725* (2013.01); *G03F 7/70766* (2013.01); *G03F 7/70783* (2013.01); *B29C 2059/023* (2013.01)

(58) Field of Classification Search
None
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,051,815 A * | 4/2000 | Satou | 219/444.1 |
| 6,180,239 B1 | 1/2001 | Whitesides et al. | |
| 6,334,960 B1 | 1/2002 | Willson et al. | |

(Continued)

FOREIGN PATENT DOCUMENTS

| | | |
|---|---|---|
| JP | 2004-006706 | 1/2004 |
| JP | 2004-158610 | 6/2004 |

(Continued)

OTHER PUBLICATIONS

Japanese Office Action mailed Oct. 18, 2011 in corresponding Japanese Patent Application No. 2009-234675.

(Continued)

*Primary Examiner* — Benjamin Schiffman
(74) *Attorney, Agent, or Firm* — Pillsbury Winthrop Shaw Pittman LLP

(57) ABSTRACT

An imprint lithography apparatus and manufacturing method can lead to mechanical stress being formed in a substrate to which an imprint pattern is being applied. This may cause strain within the substrate leading to misalignment of a subsequent pattern with an earlier pattern in a part of the substrate, which is strained. An apparatus and method is disclosed which allows for stress relaxation in the substrate prior to further patterning to reduce, minimize or prevent such misalignment from residual strain. This is achieved by locally unclamping a portion of substrate (including optionally the entire substrate) from a corresponding portion of substrate holder so that mechanical stress leading to local strain may relax prior to further patterning. To overcome residual frictional force between the substrate and substrate holder, the substrate and substrate holder may be physically separated prior to further patterning.

18 Claims, 6 Drawing Sheets

(56) References Cited

U.S. PATENT DOCUMENTS

| | | |
|---|---|---|
| 6,734,117 B2 | 5/2004 | Sogard |
| 6,980,282 B2 | 12/2005 | Choi et al. |
| 7,636,999 B2 | 12/2009 | Choi et al. |
| 7,691,313 B2 | 4/2010 | Choi et al. |
| 2003/0176079 A1 | 9/2003 | Sogard |
| 2004/0112861 A1 | 6/2004 | Choi et al. |
| 2004/0124566 A1 | 7/2004 | Sreenivasan et al. |
| 2005/0274693 A1 | 12/2005 | Heidari et al. |
| 2006/0172553 A1 | 8/2006 | Choi et al. |
| 2007/0262049 A1 | 11/2007 | Miyajima et al. |

FOREIGN PATENT DOCUMENTS

| | | |
|---|---|---|
| JP | 2006-506814 | 2/2006 |
| JP | 2006-135062 | 5/2006 |
| JP | 2007-305895 | 11/2007 |
| JP | 2008-529826 | 8/2008 |
| WO | WO 02/067055 A2 | 8/2002 |

OTHER PUBLICATIONS

Haisma, J., et al., "Mold-assisted nanolithography: A process for reliable pattern replication", J. Vac. Sci. Technol. B. vol. 14, No. 6, Nov./Dec. 1996.

Japanese Office Action mailed Jun. 29, 2012 in corresponding Japanese Patent Application No. 2009-234675.

Japanese Office Action mailed Apr. 16, 2013 in corresponding Japanese Patent Application No. 2009-234675.

Japanese Office Action mailed May 8, 2014 in corresponding Japanese Patent Application No. 2013-169108.

* cited by examiner

IMPRINT LITHOGRAPHY METHOD

This application claims priority and benefit under 35 U.S.C. §119(e) to U.S. Provisional Patent Application No. 61/136,963, entitled "Imprint Lithography Apparatus and Method", filed on Oct. 17, 2008. The content of that application is incorporated herein in its entirety by reference.

FIELD

The present invention relates to an imprint lithography apparatus and a method for manufacture of a device.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) radiation lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Lithography typically involves applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause the device to be non-functional. A lithographic apparatus therefore usually includes an alignment apparatus, which may be used to align each pattern with a previously provided pattern, and/or with alignment marks provided on the substrate.

SUMMARY

Typically, the substrate is clamped to a substrate holder and the substrate holder and/or the imprint template (or imprint templates) is moveable relative to the other between imprints. Generally, a control system, such as a computer running a computer program, uses information from the alignment apparatus to control the positions of the substrate and the imprint template relative to each other as each pattern is imprinted.

Strain (for instance, a non-linear displacement) of the substrate may arise from a mechanical stress induced in the substrate during patterning of the substrate, such as during imprinting of the substrate. Such stress may arise from slippage between the substrate and the substrate holder as imprinting takes place, possibly because of the high force arising as the template imprints the substrate, or possibly because of the force needed to overcome the adhesion between the substrate and the imprint template when the imprint template is detached or pulled away from the substrate after patterning the substrate. The presence of a part of the substrate which has slipped alongside a part of the substrate which is still clamped in its original position on the substrate holder, may lead to compressive and tensile stress within the substrate, and consequent straining of the substrate. Such strain in a clamped substrate may lead to local misalignment of a pattern subsequently applied to the substrate. This may lead to a reduced device yield from the processed substrate and consequent wastage.

It is desirable, for example, to provide a method and apparatus to overcome one or more of the problems mentioned herein or one or more of the problems not mentioned herein.

In an embodiment, a lithography method and apparatus is provided that allows mechanical stress within a substrate to be relaxed, consequently relaxing strain in the substrate, whereby the accuracy of alignment of a subsequently applied pattern may be improved across a substrate. The substrate referred to herein may be a simple substrate, such as a wafer, but may also include one or more layers of other materials of imprintable or imprinted medium or may already comprise processed layers. Patterning may be applied to one or more of these layers.

In an embodiment, there is provided a method of patterning a substrate by imprint lithography, the method comprising:

having an imprint template in contact with a substrate so as to pattern the substrate, the substrate at least partially releasably clamped to a substrate holder;

having the imprint template come out of contact with the substrate;

unclamping a first portion of substrate from a corresponding portion of the substrate holder such that mechanical stress in the substrate is relaxed; and carrying out further patterning of the substrate.

In an embodiment, there is provided a method for relaxing mechanical stress induced in a substrate in imprint lithography, the method comprising:

bringing an imprint template into contact with a substrate so as to pattern the substrate, the substrate releasably clamped to a substrate holder;

separating the imprint template and the substrate;

unclamping a first portion of the substrate from a corresponding portion of the substrate holder such that mechanical stress in the substrate is relaxed; and carrying out further patterning of the substrate.

One or more of the following aspects are applicable to the method of an embodiment of the invention where appropriate. When suitable, combinations of the following aspects may be employed as part of the method. The term "unclamping" as used herein may mean fully releasing a portion of substrate from a corresponding portion of substrate holder or may mean partially releasing a portion of substrate from a corresponding portion of substrate holder sufficiently for stress in the substrate to be relaxed.

In this specification, the term "imprint template" includes a single imprint template or a plurality of imprint templates. For instance, the contacting between the substrate and an imprint template includes contacting between the substrate and a plurality of imprint templates substantially contacting the substrate in parallel or contacting the substrate sequentially.

The first portion of substrate may be re-clamped to the substrate holder prior to carrying out further patterning. A second portion of substrate may be clamped to the substrate holder while carrying out further patterning. In an embodiment, at least some part of the substrate may be clamped to the substrate holder while movement or patterning of the substrate is effected.

In an embodiment, the substrate holder may comprise a plurality of regions, each region may be independently clamped to or released from a corresponding portion of the substrate. The unclamping and clamping of each region may be carried out in a sequence where at least one region is clamped to the substrate at any time during the sequence.

The first portion of substrate may be the entire substrate or may be a part of the substrate.

In an embodiment, the substrate may be aligned prior to further patterning.

The unclamping may be effected while the substrate holder is stationary or moving, e.g. accelerating, decelerating or rotating. The unclamping may be effected while the substrate holder is stationary or moving at a constant velocity in order to avoid unintended displacement of the substrate relative to the substrate holder.

In an embodiment, clamping may be by electrostatic or magnetic attraction between the substrate holder and the substrate. A further clamping method is by reduced pressure between the substrate holder and the substrate, also known in the art as vacuum clamping. Combinations of different clamping methods may be employed.

The method may comprise separating the unclamped first portion of substrate from the corresponding portion of substrate holder prior to carrying out further patterning of the substrate. This may be effected by applying an overpressure between the unclamped first portion of substrate and the corresponding portion of substrate holder, for instance by means of a pressurized gas supply. Separation may be effected by one or more structures (for instance, a peg or pin) moving from a retracted position within the substrate holder to a deployed configuration projecting from the substrate holder and contacting the substrate to push the unclamped first portion of substrate from the substrate holder. In another means for effecting separation, the substrate holder may comprise a plurality of segments, wherein the separation of the unclamped first portion of substrate from the corresponding portion of substrate holder is effected by displacing a corresponding segment of the substrate holder away from the corresponding first portion of substrate. Other suitable methods for separating the substrate and the substrate holder may be employed, such as an externally applied vacuum or an electric or magnetic field to lift the substrate from the substrate holder. An actuator such as a piezoelectric, linear motor, electrostatic or magnetic actuator may form part of the substrate holder to effect the separation. In an embodiment, the substrate, or a part of the substrate, is re-clamped to the substrate holder, as explained above, after separation and prior to carrying out further patterning of the substrate.

In an embodiment, the stress relaxation of the substrate may take place during and/or after the patterning of the substrate. In an embodiment, the stress relaxation of the substrate may take place after each patterning of the substrate, or it may take place after a series of pattern imprints, especially if the patterned regions are at remote locations from each other on the substrate, such that stress induced by one patterning application does not significantly influence other patterned regions of the substrate. Where multiple imprint templates are applied to each substrate, the stress relaxation can take place, for example, after one, some or all templates have made their imprint.

In an embodiment, there is provided an apparatus for imprint lithography of a substrate, the apparatus comprising:
an imprint template holder configured to hold an imprint template arranged to imprint a substrate;
a substrate holder configured to at least partially releasably clamp the substrate to the substrate holder; and
a control system configured to control the clamping of the substrate by the substrate holder, the control system configured to unclamp a portion of the substrate from the substrate holder following contact between the substrate and the imprint template.

In an embodiment, there is provided an imprint lithography apparatus for patterning a substrate, the apparatus comprising a substrate holder comprising a plurality of regions, each region configured to be independently clamped to or released from a corresponding portion of the substrate. The imprint lithography apparatus may further comprise a separation arrangement configured to separate an unclamped portion of the substrate from a corresponding portion of the substrate holder.

The control system will typically be a software program running on a computer system functionally connected to or forming part of the lithography apparatus.

The imprint lithography apparatus may further comprises an alignment system. An alignment system for such a lithography apparatus is well known in the art. The control system may be configured to control relative alignment of the imprint template and of the substrate, and may be configured to control the alignment system. The control system may be configured to control the imprinting of the substrate. In an embodiment, these actions are co-ordinated through the control system.

Where appropriate, one or more aspects mentioned above as applicable to the method of an embodiment of the invention are applicable to the apparatus of an embodiment of the invention.

The substrate holder may comprise a plurality of regions, each region configured to be independently clamped to or released from a corresponding portion of the substrate. The substrate holder may be configured to hold the substrate by electrostatic or magnetic attraction between the substrate holder and the substrate. The substrate holder may be configured to hold the substrate by forming a reduced pressure between the substrate holder and the substrate, known in the art as vacuum clamping. The substrate holder may be configured to use a combination of different clamping methods.

The apparatus may comprise a separation arrangement configured to separate the unclamped portion of the substrate from the corresponding portion of the substrate holder. The separation arrangement may be configured to apply an overpressure between the unclamped portion of the substrate and the corresponding portion of substrate holder, for instance by including a pressurized gas supply. A suitable separation arrangement may comprise one or more structures, for instance a peg or pin, moveable from a retracted position within the substrate holder to a deployed configuration projecting from the substrate holder whereby the substrate is pushed from the substrate holder. A further suitable separation arrangement may comprise a plurality of segments of the substrate holder, each segment configured to be individually displaceable away from the substrate.

The imprint template holder may comprise a plurality of imprint template holders and/or the imprint template may comprise a plurality of imprint templates.

In an embodiment, there is provided an imprint lithography apparatus for patterning a substrate, the apparatus comprising a substrate holder comprising a plurality of regions, each region configured to be independently clamped to or released from a corresponding portion of the substrate. The imprint lithography apparatus may further comprise a separation arrangement configured to separate an unclamped portion of the substrate from a corresponding portion of the substrate holder.

The apparatus and method described herein are particularly useful for manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, etc. For example, the method and apparatus is suitable for high resolution lithography, where features patterned onto a substrate have a feature width or critical dimension of about 1 μm or less, typically 100 nm or less or even 10 nm or less.

BRIEF DESCRIPTION OF THE DRAWINGS

Specific embodiments of the invention will be described with reference to the accompanying figures, in which.

DETAILED DESCRIPTION

Figure 1A:
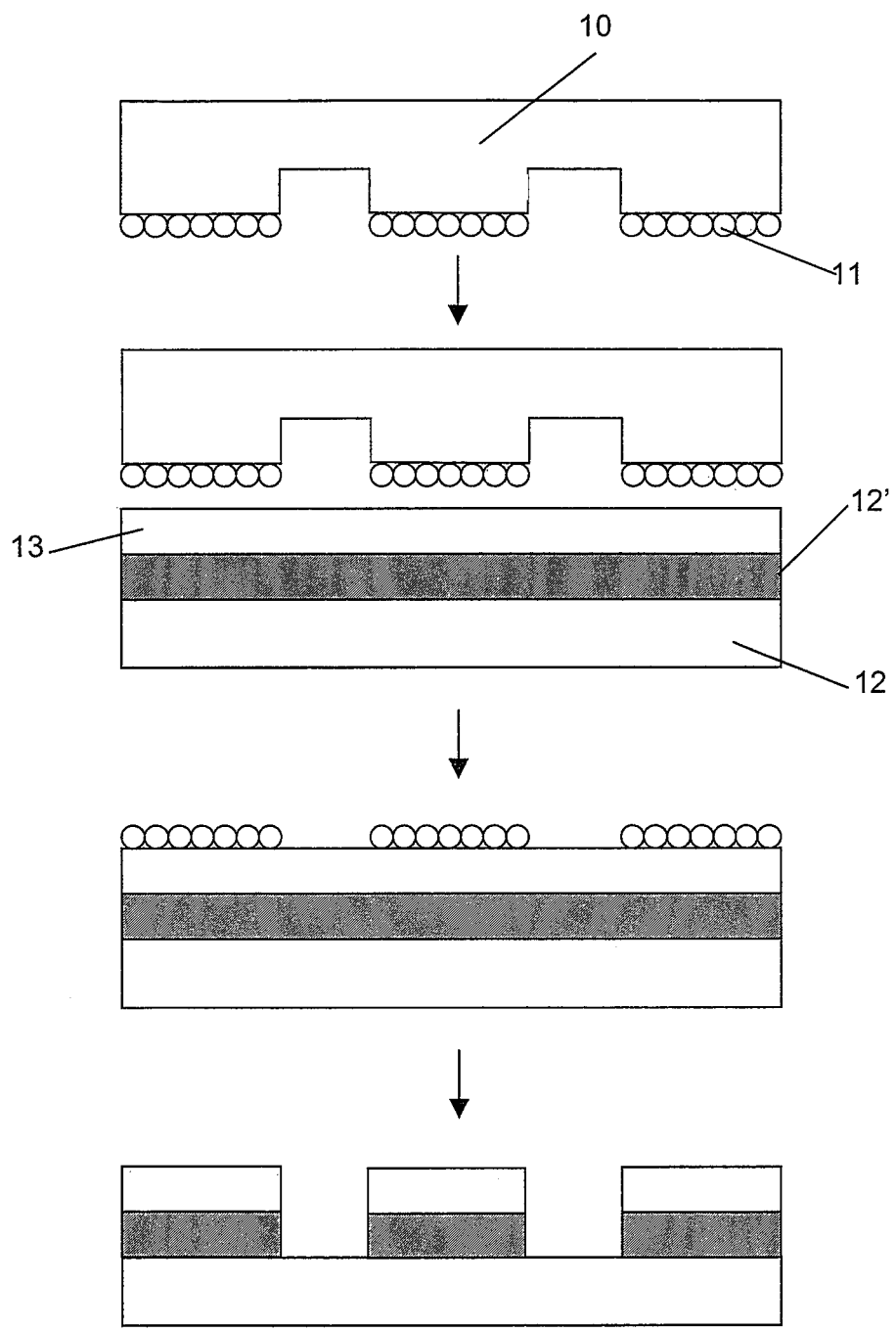
FIGS. 1a-c schematically show examples of, respectively, micro-contact printing, hot imprint, and ultra violet (UV) radiation imprint.
Figure 1B:
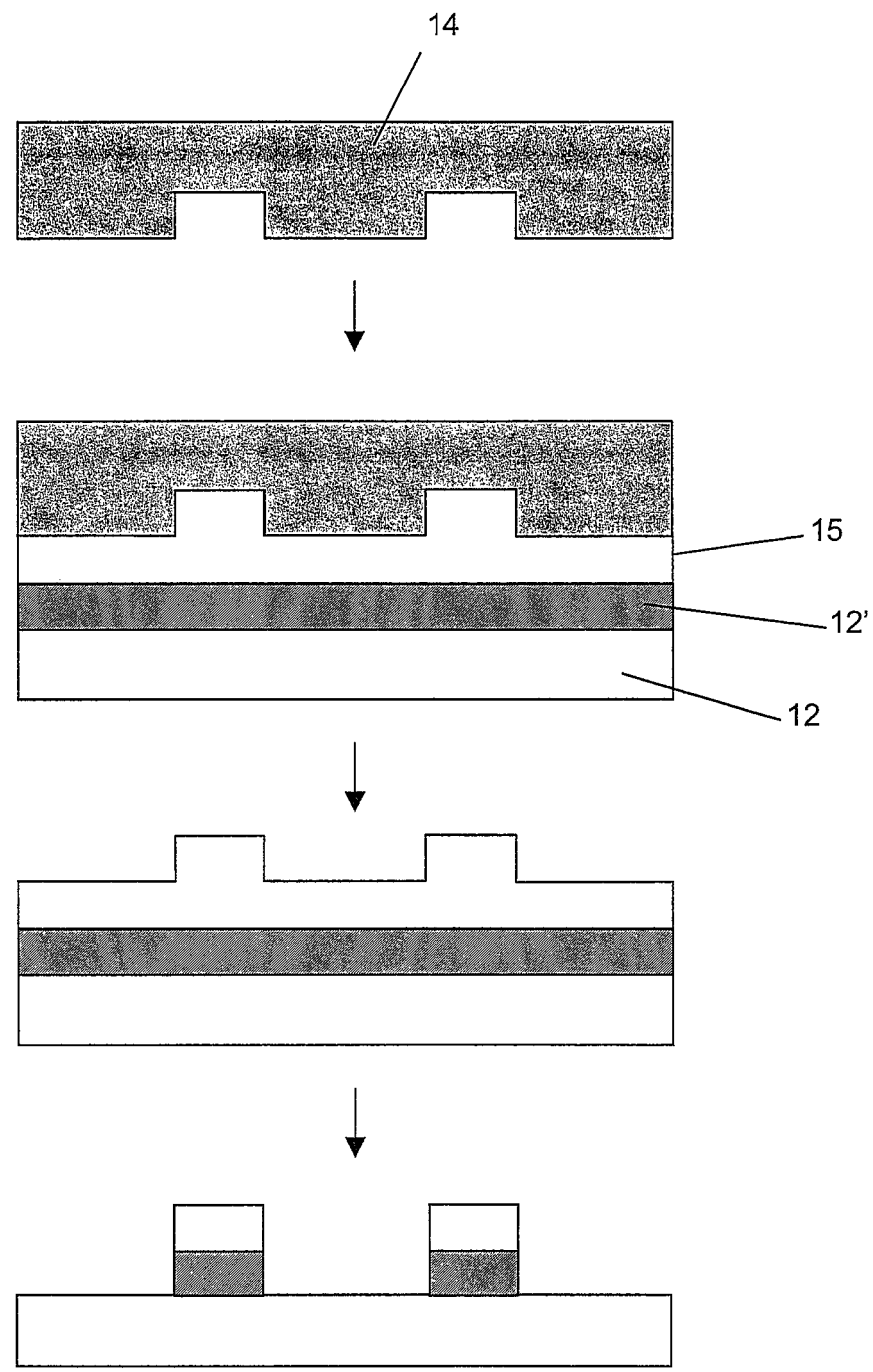
Figure 1C:
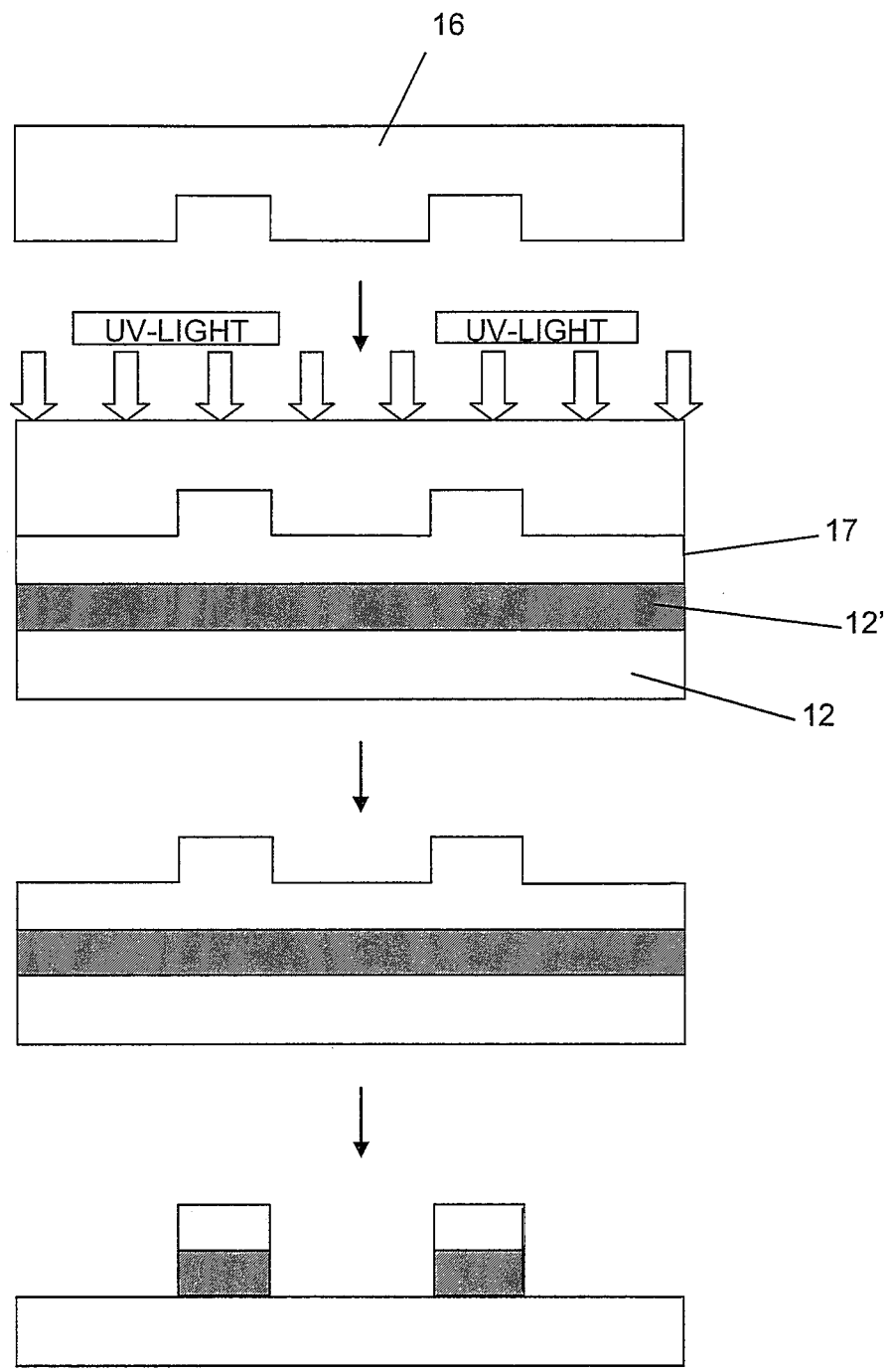

Examples of three known approaches to imprint lithography are schematically depicted in FIGS. 1a to 1c.

FIG. 1a shows an example of a type of imprint lithography that is often referred to as micro-contact printing. Micro-contact printing involves transferring a layer of molecules 11 (typically an ink such as a thiol) from a template 10 (e.g. a polydimethylsiloxane template) onto a imprintable medium layer 13 which is supported by a substrate 12 and planarization and transfer layer 12'. The template 10 has a pattern of features on its surface, the molecular layer being disposed upon the features. When the template 10 is pressed against layer 13, the layer of molecules 11 are transferred onto layer 13. After removal of the template 10, layer 13 is etched such that the areas of the layer 13 not covered by the transferred molecular layer are etched down to the substrate 12. For more information on micro-contact printing, see e.g. U.S. Pat. No. 6,180,239.

FIG. 1b shows an example of so-called hot imprint lithography (or hot embossing). In a typical hot imprint process, a template 14 is imprinted into a thermosetting or a thermoplastic imprintable medium 15, which has been cast on the surface of a substrate 12. The imprintable medium 15 may be, for example, resin. The resin may, for instance, be spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 14 may then be removed and the patterned resin cooled. In hot imprint lithography employing a layer of thermoplastic polymer resin, the thermoplastic resin is heated so that it is in a freely flowable state immediately prior to imprinting with the template 14. It may be necessary to heat a thermoplastic resin to a temperature considerably above the glass transition temperature of the resin. The template is pressed into the flowable resin and then cooled to below its glass transition temperature with the template 14 in place to harden the pattern. Thereafter, the template 14 is removed. The pattern will consist of the features in relief from a residual layer of the resin which residual layer may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1c shows an example of ultra violet radiation (UV) imprint lithography, which involves the use of a transparent template and a UV-curable liquid as imprintable medium (the term "UV" is used here for convenience but should be interpreted as including any suitable actinic radiation for curing the imprintable medium). A UV curable liquid is often less viscous than the thermosetting and thermoplastic resin used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is frozen by curing the imprintable medium 17 with UV that is applied through the quartz template onto the imprintable medium 17. The template is then removed. The pattern will consist of the features in relief from a residual layer of the imprintable medium which residual layer may then be removed by an appropriate etch process to leave only the pattern features.

A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. United States Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., United States Patent Application Publication No. 2005-0274693, which mentions a combination of heating and UV curing an imprintable medium.

Figure 2A:
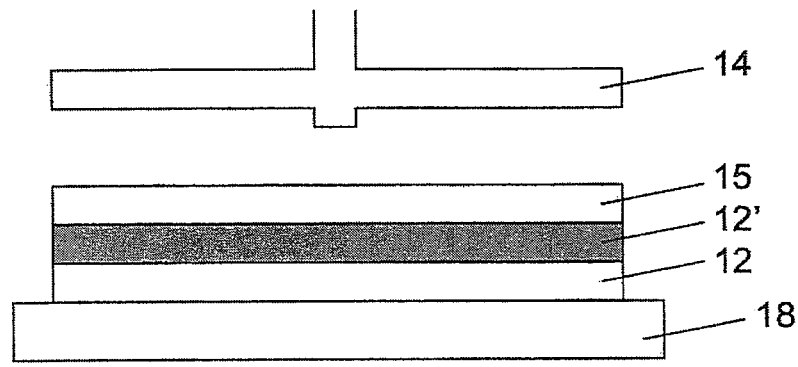
FIGS. 2a to 2c schematically show a cross-sectional view of a hot imprinting process resulting in mechanical stress in the substrate.
Figure 2B:
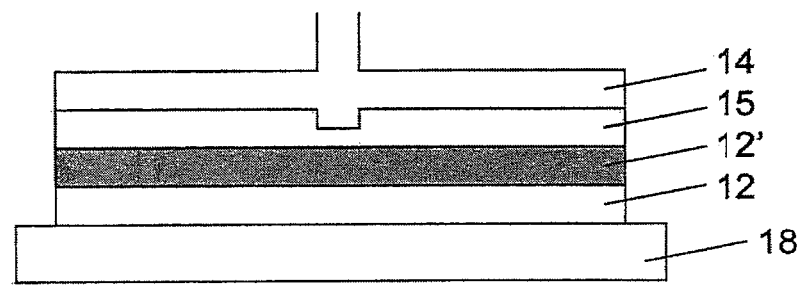
Figure 2C:
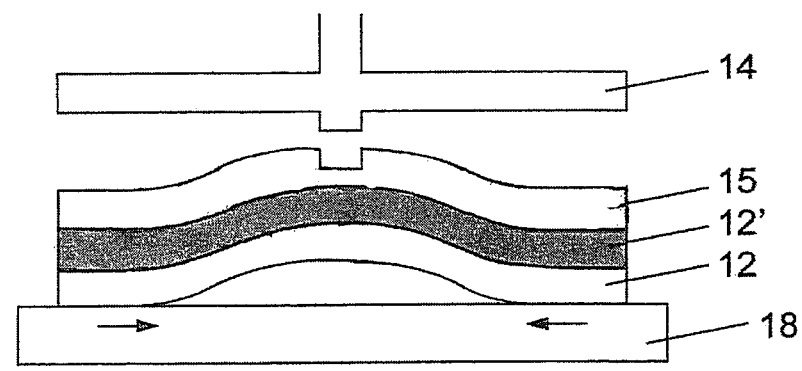

FIGS. 2a-c show schematically how an imprint lithography process, for instance such as that detailed above for FIG. 1b, may lead to the development of stress in a substrate. Although the following Figures and embodiments of the invention are based on the process detailed for FIG. 1b, they would be applicable to the imprint lithography processes detailed for FIGS. 1a and 1c and to any other suitable imprint lithography process or other patterning process where mechanical strain arises in the substrate during the patterning process.

FIG. 2a shows the substrate 12 clamped to a substrate holder 18 with an imprint template 14 in position ready to come into contact with the medium 15 on the substrate 12. In FIG. 2b, the imprint template 14 held by an imprint template holder has come into contact with the medium 15 on the substrate 12 in order to imprint the medium 15. FIG. 2c shows schematically the development of stress in the substrate 12 following the detachment of the imprint template 14 from the imprintable medium 15 (e.g., by moving template 14 away from the imprintable medium 15 and/or moving imprintable medium 15 away from the template 14). The force required to separate the imprint template 14 from the imprint medium 15 has resulted in the substrate 12 becoming locally separated from the substrate holder 18 in the region below the imprinted segment of medium 15. Slippage of the substrate 12 has occurred in the directions of the arrows as shown in FIG. 2c. This leads to the development of mechanical stress within the substrate 12. Typically, in an imprint lithography process, the substrate 12 is repositioned with the assistance of an alignment system prior to further imprinting by the same or other imprint template 14. Such alignment is generally effected by measurement of the position of alignment marks on the substrate 12. Mechanical stress present within the substrate 12 as shown schematically in FIG. 2c will mean that it may not be possible for the consequently strained region to be accurately aligned by means of positioning of an alignment mark on the substrate using the alignment apparatus. This may lead to incorrect alignment of a region of the substrate, where it has been strained, when further patterning of the substrate takes place.

Figure 3:
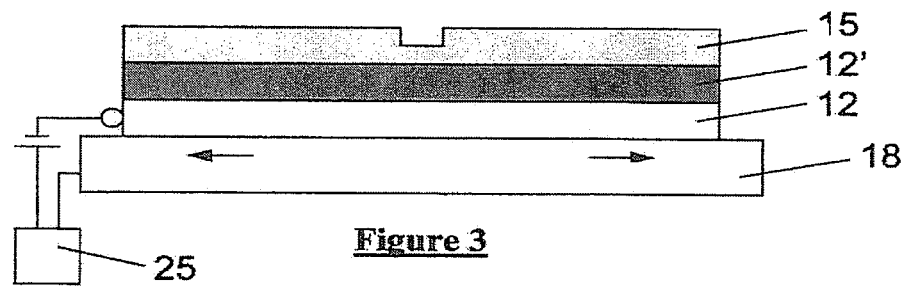
FIG. 3 schematically shows an embodiment of the invention using an electrostatic substrate holder to release mechanical stress from a substrate by means of a method of an embodiment of the invention.

FIG. 3 shows schematically a cross-sectional view of the relaxation of stress in an imprinted substrate by means of an embodiment the invention. A control system 25 is functionally connected to an electrical voltage source, such as a battery 20, and to the substrate holder 18. The battery 20 provides an electrical potential difference between the substrate holder 18 and the substrate 12 so that the substrate 12 is electrostatically clamped to the substrate holder 18. When mechanical stress within the substrate 12 is to be released, the control system 25 switches off the electrostatic clamping allowing the mechanical stress in the substrate 12 as developed in FIG. 2c to relax by slippage in the direction of the arrows shown in FIG. 3. Although the embodiment in FIG. 3 uses electrostatic clamping, the same principle may be applied using a further clamping method, such as vacuum clamping where a reduced pressure between the substrate holder 18 and the substrate 12 holds the substrate 12 in place (by ambient atmospheric pressure pushing the substrate 12 into the substrate holder 18).

Figure 4:
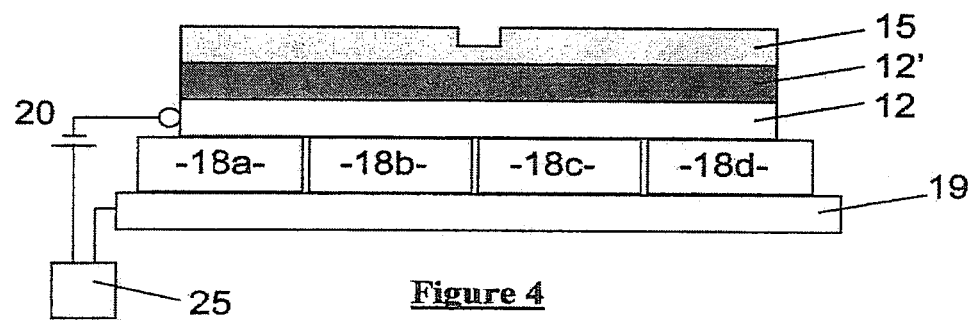
FIG. 4 schematically shows an embodiment of the invention making use of an electrostatic substrate holder comprising a plurality of regions, wherein each region may be independently clamped to or released from a corresponding portion of the substrate.

FIG. 4 shows a schematic cross-sectional view of an embodiment of a substrate holder assembly suitable for use in the method and apparatus of an embodiment of the invention for lithography. The substrate holder is segmented into a number of regions 18a, 18b, 18c, 18d, each of which is located on an actuating bed 19. The substrate 12 sits on a surface of each of the substrate holder regions 18a to d. A potential difference is applied between the substrate holder regions 18a to d and the substrate 12 by means of, for example, a battery 20. The actuating bed 19 independently controls the potential difference applied to each of the substrate holder regions 18a to 18d, in response to a signal from the control system 25 such that each of the substrate holder regions 18a to 18d may be individually released or clamped to the substrate, independently of the other substrate holder regions. This enables a sequence of clamping and unclamping to be employed in order to release stress from the substrate 12 while ensuring that at least one of the substrate holder regions 18a to 18d is holding the substrate 12 in place to prevent it becoming detached from the substrate holder regions 18a to 18d.

Figure 5:
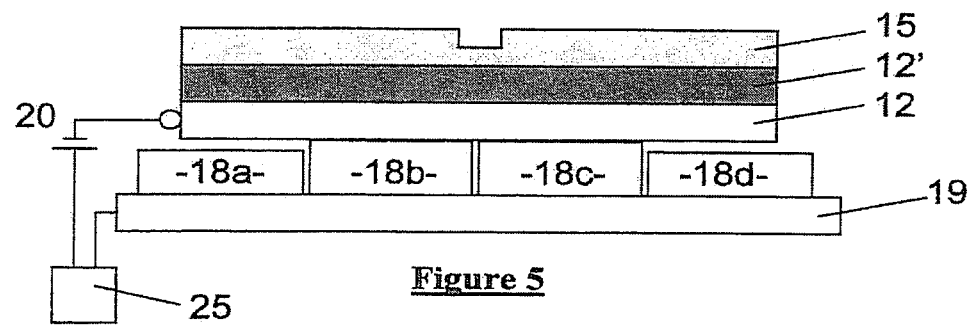
FIG. 5 schematically shows an embodiment of the invention making use of a segmented electrostatic substrate holder with segments moveable relative to the substrate.

FIG. 5 shows a schematic cross sectional view of an embodiment of a substrate holder assembly suitable for use in the method and apparatus of an embodiment of the invention for lithography. As with the embodiment shown in FIG. 4, each of the substrate holder regions 18a, 18b, 18c, 18d may be individually clamped or released from the surface of the substrate 12. Additionally or alternatively, the actuating bed 19 is configured to be capable of retracting each of the substrate holder regions 18a to 18d individually and independently of the other substrate holder regions 18a to 18d such that the substrate holder regions 18a to 18d may be separated from the surface of the substrate 12. In the configuration shown schematically in FIG. 5, the substrate holder regions 18a and 18d are retracted from the surface of the substrate 12 such that there is a gap between the substrate holder and the substrate 12 for each of these substrate holder regions 18a, 18d. This separation ensures that any residual frictional forces remaining between the substrate holder and the substrate after unclamping of the substrate holder from the surface of the substrate 12 will be removed, allowing more complete relaxation of stress in the substrate 12.

Figure 6:
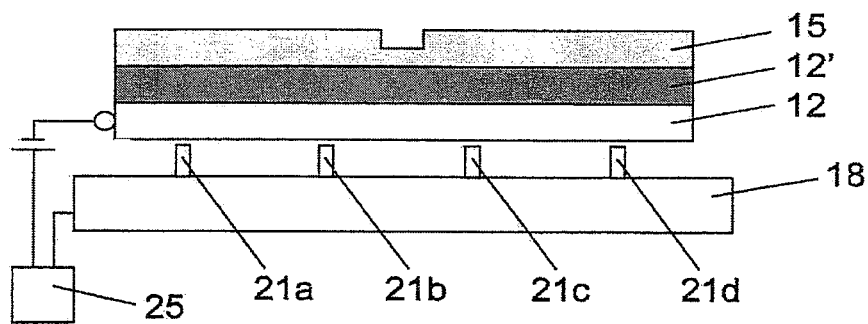
FIG. 6 schematically shows an embodiment of the invention using mechanical lifting by one or more structures to achieve separation of the substrate from the substrate holder.

FIG. 6 shows a further embodiment, in schematic cross sectional form, of a substrate holder assembly suitable for use in the method and apparatus of an embodiment of the invention for lithography. The substrate holder 18 is provided with one or more structures, in this example taking the form of pins 21a, 21b, 21c, 21d, which may project through the surface of the substrate holder to push the substrate 12 away from the substrate holder. In the embodiment shown, the substrate holder 18 is not segmented, but this use of pins may also be used with a segmented substrate holder as shown in the embodiments of FIG. 4 or 5. Following unclamping of the substrate holder 18 from the substrate 12, the pins 21a to 21d are moved from a retracted position within the substrate holder to a deployed position as shown in FIG. 6. This results in the substrate 12 being lifted from the substrate holder 18 and reduces considerably any frictional forces between the substrate 12 and the substrate holder 18 such that mechanical stress of the substrate may more readily relax. Rather than all of the pins 21a to 21d being moved in unison, each may be individually controlled, independently of the other pins.

Figure 7:
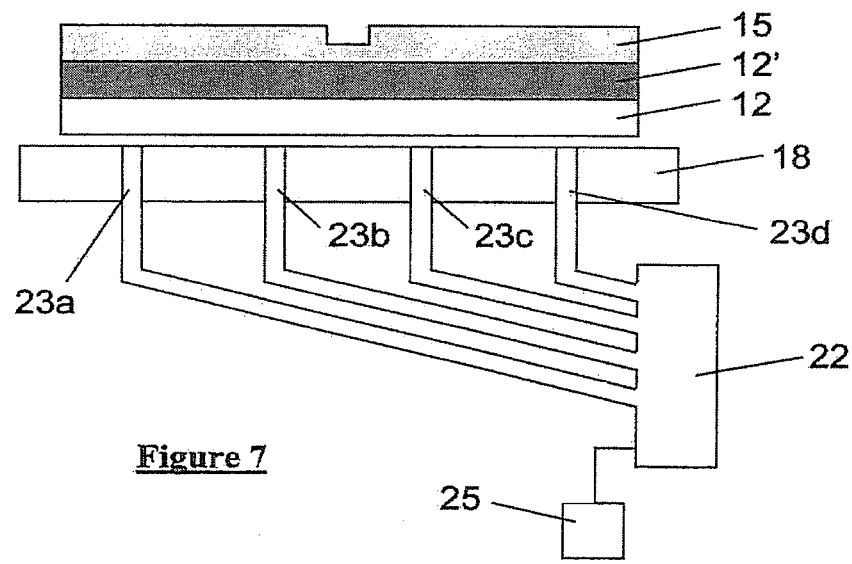
FIG. 7 schematically shows an embodiment of the invention using an overpressure between the substrate and the substrate holder to lift the substrate from the substrate holder.

FIG. 7 shows a further embodiment, in schematic, form, of a substrate holder assembly suitable for use in the method and apparatus of an embodiment of the invention for lithography. The substrate holder 18 is provided with one or more gas conduits, in this example gas conduits 23a to 23d, which are connected to a pressure controller 22. The clamping of the substrate 12 to the substrate holder 18 is achieved by the pressure controller 22 reducing the pressure in the conduits 23a to 23d to give a reduced pressure, compared to ambient pressure, between the surface of the substrate 12 and the substrate holder 18. In order to release mechanical stress in the substrate, the pressure controller 22 can individually and independently change the pressure at any of the conduits 23a-23d from a reduced pressure to an over-pressure such that the substrate 12 is locally pushed away from the substrate holder 18 by the overpressure of gas provided by the specified conduit 21a-d between the substrate 12 and the substrate holder 18. In the example shown in FIG. 7, a positive pressure has been applied at each of the conduits 23a-23d such that the entire substrate 12 has been pushed away from the substrate holder 18.

It will be appreciated that numerous modifications to the above described embodiments may be made without departing from the scope of the invention as defined in the appended claims. For example, the imprinting method used may be by a UV imprinting process as detailed above for FIG. 1c, rather than the hot embossing as shown.

The described and illustrated embodiments are to be considered as illustrative and not restrictive in character, it being understood that only particular embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. A method of patterning a substrate, the method comprising:
    patterning the substrate while the substrate is at least partially releasably clamped to a substrate holder, the substrate holder comprising at least three movable parts configured to contact the substrate, each movable part able to move separately and independently of the other movable parts;
    unclamping a first portion of the substrate from a corresponding portion of the substrate holder such that stress in the substrate is relaxed;
    displacing at least one of the three movable parts of the substrate holder to apply a force, or to remove application of a force, to directly cause the unclamped first portion of substrate to be separated by a gap from the corresponding portion of substrate holder prior to carrying out further patterning of the substrate;
    re-clamping the separated first portion of substrate to the substrate holder; and
    carrying out the further patterning of the substrate with the first portion of substrate clamped on the substrate holder, wherein the substrate does not come out of contact with the substrate holder after the separation of the first portion of the substrate until, and including, the further patterning.

2. The method of claim 1, wherein a second portion of substrate is unclamped from to the substrate holder while carrying out further patterning.

3. The method of claim 1, wherein the substrate holder comprises a plurality of regions wherein each region may be independently clamped to or released from a corresponding portion of the substrate.

4. The method of claim 3, wherein the unclamping and clamping of each region is carried out in a sequence where at least one region is clamped to the substrate at any time during the sequence.

5. The method of claim 1, wherein clamping is by electrostatic attraction or magnetic attraction between the substrate holder and the substrate.

6. The method of claim 1, wherein clamping is by reduced pressure between the substrate holder and the substrate.

7. The method of claim 1, wherein displacing at least one of the three movable parts of the substrate holder to separate the unclamped first portion of substrate from the corresponding portion of substrate holder is effected by a structure moving from a retracted position within the substrate holder to a deployed configuration projecting from the substrate holder and contacting the substrate to push the unclamped first portion of substrate from the substrate holder.

8. The method of claim 1, wherein the substrate holder comprises a plurality of segments and wherein displacing at least one of the three movable parts of the substrate holder to separate the unclamped first portion of substrate from the corresponding portion of substrate holder is effected by displacing a corresponding segment of the substrate holder away from the corresponding unclamped first portion of substrate.

9. The method of claim 1, wherein the corresponding portion is a clamping portion of the substrate holder and wherein displacing at least one of the three movable parts of the substrate holder to separate the unclamped first portion of substrate from the corresponding clamping portion of the substrate holder is effected by displacing the corresponding clamping portion of the substrate holder away from the corresponding unclamped first portion of the substrate.

10. The method of claim 1, wherein the patterning comprises bringing an imprint lithography imprint template into contact with a substrate so as to pattern the substrate.

11. A method comprising:
    patterning the substrate while the substrate is releasably clamped to a substrate holder, the substrate holder comprising at least three movable parts configured to contact the substrate, each movable part able to move separately and independently of the other movable parts;
    unclamping a first portion of the substrate from a corresponding portion of the substrate holder such that mechanical stress in the substrate is relaxed;
    separating the unclamped first portion of substrate from the corresponding portion of substrate holder by a gap, prior to carrying out further patterning of the substrate, by displacing at least one of the three movable parts;
    re-clamping the separated first portion of substrate to the substrate holder; and
    carrying out the further patterning of the substrate with the first portion of substrate clamped on the substrate holder, wherein the substrate does not come out of contact with the substrate holder after the separation of the first portion of the substrate until, and including, the further patterning.

12. The method of claim 11, wherein separating the unclamped first portion of substrate by displacing at least one of the three movable parts comprises moving a structure from a retracted position within the substrate holder to a deployed configuration projecting from the substrate holder and contacting the substrate to push the unclamped first portion of substrate from the substrate holder.

13. The method of claim 11, wherein the patterning comprises bringing an imprint lithography imprint template into contact with a substrate so as to pattern the substrate.

14. A method comprising:
    patterning the substrate while the substrate is releasably clamped to a substrate holder, the substrate holder comprising at least three movable parts configured to contact the substrate, each movable part able to move separately and independently of the other movable parts;
    unclamping a first portion of the substrate from a corresponding clamping portion of the substrate holder such that stress in the substrate is relaxed;
    separating the unclamped first portion of the substrate from the corresponding clamping portion of the substrate holder by a gap, prior to carrying out further patterning of the substrate, by displacing the corresponding clamping portion of the substrate holder away from the corresponding unclamped first portion of the substrate, the corresponding clamping portion being at least one of the at least three movable parts; and carrying out the further patterning of the substrate clamped to the substrate holder.

15. The method of claim 14, wherein the substrate holder comprises a plurality of segments, each segment configured to apply a clamping force, and wherein displacing the corresponding clamping portion of the substrate holder away from the corresponding unclamped first portion of the substrate is effected by displacing a corresponding segment of the substrate holder away from the corresponding unclamped first portion of the substrate.

16. The method of claim 14, wherein, while carrying out the further patterning, the first portion is unclamped from the substrate holder and a second portion of substrate is clamped to the substrate holder.

17. The method of claim 14, wherein the substrate does not come out of contact with the substrate holder after the separation of the first portion of the substrate until, and including, the further patterning.

18. The method of claim 14, wherein the patterning comprises bringing an imprint lithography imprint template into contact with a substrate so as to pattern the substrate.

* * * * *